US012647034B2

(12) United States Patent
Rubinic et al.

(10) Patent No.: US 12,647,034 B2
(45) Date of Patent: Jun. 2, 2026

(54) FLYBACK CONVERTER ACTIVE CLAMP CONTROL SYSTEM AND METHODS

(71) Applicant: Silanna Asia Pte Ltd, Singapore (SG)

(72) Inventors: Jaksa Rubinic, Stittsville (CA);
Aleksandar Radic, British Columbia (CA)

(73) Assignee: Silanna Asia Pte Ltd, Singapore (SG)

( * ) Notice: Subject to any disclaimer, the term of this patent is extended or adjusted under 35 U.S.C. 154(b) by 284 days.

(21) Appl. No.: 18/593,226

(22) Filed: Mar. 1, 2024

(65) Prior Publication Data

US 2024/0322693 A1      Sep. 26, 2024

Related U.S. Application Data

(60) Provisional application No. 63/492,003, filed on Mar. 24, 2023.

(51) Int. Cl.
H02M 3/335          (2006.01)
H02M 1/088          (2006.01)
(Continued)

(52) U.S. Cl.
CPC ....... H02M 3/33507 (2013.01); H02M 1/088 (2013.01); H02M 3/015 (2021.05); H03K 17/102 (2013.01)

(58) Field of Classification Search
CPC .. H02M 3/33507; H02M 1/088; H02M 3/015; H02M 1/342; H02M 3/33523; H02M 1/0058; H03K 17/102
See application file for complete search history.

(56) References Cited

U.S. PATENT DOCUMENTS 10,038,388 B2 *    7/2018   Koo .................. H02M 3/33561
10,069,426 B2 *    9/2018   Rana ................. H02M 3/33569
(Continued)

FOREIGN PATENT DOCUMENTS

CN          113410994 A      9/2021
JP          2015167443 A     9/2015
KR          1020160125676 A  11/2016

OTHER PUBLICATIONS

International Search Report and Written Opinion dated May 27, 2024 for PCT Patent Application No. PCT/IB2024/052029.
(Continued)

*Primary Examiner* — Kyle J Moody
(74) *Attorney, Agent, or Firm* — MLO, a professional corp.

(57)          ABSTRACT

A power converter includes a transformer, a main switch, an active clamp switch, and a primary side controller circuit. The primary side controller circuit is configured to indirectly measure a magnetizing current through the transformer during a first switching cycle of the power converter and estimate a zero-crossing point of the magnetizing current for a second switching cycle based on the indirect primary side measurement of the magnetizing current. Based on the estimated zero-crossing point, the primary side controller circuit generates an auto-tuned delay, for the second switching cycle, between disabling the main switch and enabling the active clamp switch before the zero-crossing of the magnetizing current occurs. The active clamp switch is enabled during the second switching cycle in accordance with the auto-tuned delay.

17 Claims, 13 Drawing Sheets

(51) Int. Cl.
   *H02M 3/00*        (2006.01)
   *H03K 17/10*       (2006.01)

(56)                    References Cited

U.S. PATENT DOCUMENTS

| 10,389,223 | B1 |   | 8/2019 | Bianco et al. |
| 11,005,364 | B1 | * | 5/2021 | Radic ..................... H02M 1/44 |
| 11,011,994 | B2 |   | 5/2021 | Radic |
| 2016/0099647 | A1 |   | 4/2016 | Zhang et al. |
| 2017/0264206 | A1 |   | 9/2017 | Rana et al. |
| 2018/0287481 | A1 |   | 10/2018 | Liu et al. |
| 2018/0294731 | A1 |   | 10/2018 | Song et al. |

OTHER PUBLICATIONS

AP3306—Highly Integrated Active Clamp Flyback PWM Control-
ler, datasheet, Diodes Incorporated, May 2022, https://www.diodes.
com/assets/Datasheets/AP3306.pdf.
UCC28781 Zero-Voltage-Switching Flyback Controller with Dedi-
cated Synchronous Rectifier Gate-Drive, datasheet, TExas Instru-
ments, Dec. 2021, https://www.ti.com/lit/ds/symlink/ucc28781.pdf?
ts=1709103951623&ref_url=https%253A%252F%252Fwww.ti.
com%252Fpower-management%252Facdc-isolated-dcdc-switching-
regulators%252Fflyback-controllers%252Fproducts.html.
UCC28782 High-Density Active-Clamp Flyback Controller with
EMI Dithering, X-Cap Discharge, and Bias Power Management,
Texas Instruments, May 2020, https://www.ti.com/lit/ds/symlink/
ucc28782.pdf?ts=1709095387658&ref_url=https%253A%252F%
252Fwww.ti.com%252Fpower-management%252Facdc-isolated-
dcdc-switching-regulators%252Fflyback-controllers%252Fproducts.
html.

* cited by examiner

Figure 7:
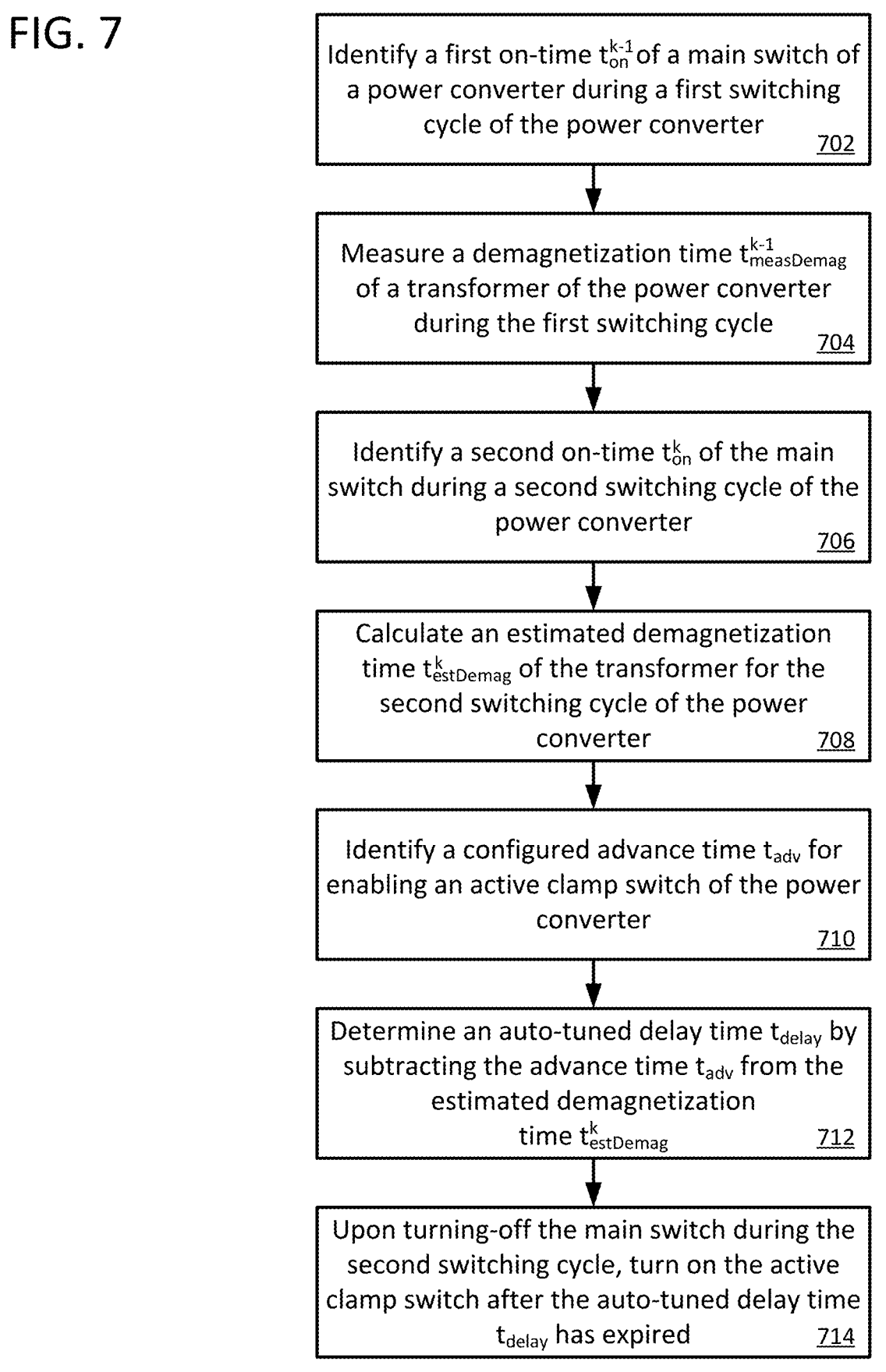

Identify a first on-time $t_{on}^{k-1}$ of a main switch of a power converter during a first switching cycle of the power converter        702

Measure a demagnetization time $t_{measDemag}^{k-1}$ of a transformer of the power converter during the first switching cycle        704

Identify a second on-time $t_{on}^{k}$ of the main switch during a second switching cycle of the power converter        706

Calculate an estimated demagnetization time $t_{estDemag}^{k}$ of the transformer for the second switching cycle of the power converter        708

Identify a configured advance time $t_{adv}$ for enabling an active clamp switch of the power converter        710

Determine an auto-tuned delay time $t_{delay}$ by subtracting the advance time $t_{adv}$ from the estimated demagnetization time $t_{estDemag}^{k}$        712

Upon turning-off the main switch during the second switching cycle, turn on the active clamp switch after the auto-tuned delay time $t_{delay}$ has expired        714

800

810

FLYBACK CONVERTER ACTIVE CLAMP CONTROL SYSTEM AND METHODS

RELATED APPLICATIONS

This application claims priority to U.S. Provisional Application No. 63/492,003, filed Mar. 24, 2023, all of which is incorporated by reference for all purposes.

BACKGROUND

Power management components, such as switch-mode power supplies ("power converters"), are used in modern electronic devices and provide efficient and galvanically isolated power to multiple loads. To achieve high power processing efficiency and/or galvanic isolation, conventionally one or more magnetically coupled elements, semiconductor switches, and associated gate driver circuits are required.

The magnetically coupled elements often suffer from non-trivial leakage inductance phenomena, which necessitates the need for affordable voltage snubber circuits to control peak drain-to-source voltages at semiconductor switches of the power converter. Recycling energy using an active clamping configuration within the power converter provides an opportunity for power converter form-factor reduction and power efficiency improvements.

SUMMARY

In some aspects, the techniques described herein relate to a power converter including: a transformer having a primary winding and a secondary winding, a first winding node of the primary winding being configured to be coupled to a voltage source to receive an input voltage, the secondary winding being configured to be coupled to a load to provide an output voltage from the input voltage; a main switch coupled to a second winding node of the primary winding to control a magnetizing current through the primary winding; an active clamp circuit including: an active clamp switch; and an active clamp capacitor coupled in a series circuit combination with the active clamp switch; and a primary side controller circuit configured to control the main switch; wherein the primary side controller circuit is configured to: indirectly measure the magnetizing current during a first switching cycle of the power converter; estimate a zero-crossing point of the magnetizing current of the transformer for a second switching cycle based on the indirect primary side measurement of the magnetizing current during the first switching cycle; generate an auto-tuned delay for the second switching cycle between disabling the main switch and enabling the active clamp switch before the zero-crossing of the magnetizing current occurs in the second switching cycle, the auto-tuned delay being based on the estimated zero-crossing point; and enable the active clamp switch during the second switching cycle in accordance with the auto-tuned delay.

In some aspects, the techniques described herein relate to a power converter including: a transformer having a primary winding and a secondary winding, a first winding node of the primary winding being configured to be coupled to a voltage source to receive an input voltage, the secondary winding being configured to be coupled to a load to provide an output voltage from the input voltage; a main switch coupled to a second winding node of the primary winding to control a magnetizing current through the primary winding; an active clamp circuit including: an active clamp switch;

and an active clamp capacitor coupled in a series circuit combination with the active clamp switch; and a primary side controller circuit configured to control the main switch; wherein the primary side controller circuit is configured to: indirectly measure the magnetizing current during a first switching cycle of the power converter; and upon determining that a peak current amplitude of one or more first magnetizing current pulses of the magnetizing current during the first switching cycle is greater than a maximum current threshold value or is less than a minimum current threshold value for a first number of magnetizing current pulses, issuing a second number of one or more second magnetizing current pulses in a second switching cycle, the second number of magnetizing current pulses being different than the first number of magnetizing current pulses; wherein: a first amount of charge delivered to the load of the power converter by the one or more first magnetizing current pulses is equal to an amount of charge delivered to the load of the power converter by the one or more second magnetizing current pulses.

BRIEF DESCRIPTION OF THE DRAWINGS

FIGS. 2A-6 are graphs of simplified signals related to the operation of the power converter shown in FIG. 1, in accordance with some embodiments.

FIG. 7 shows a simplified portion of a process for determining an auto-tuned delay for an active clamp switch of a power converter, in accordance with some embodiments.

FIGS. 8A-10B are graphs of simplified signals related to the operation of the power converter shown in FIG. 1, in accordance with some embodiments.

DETAILED DESCRIPTION

Figure 1:
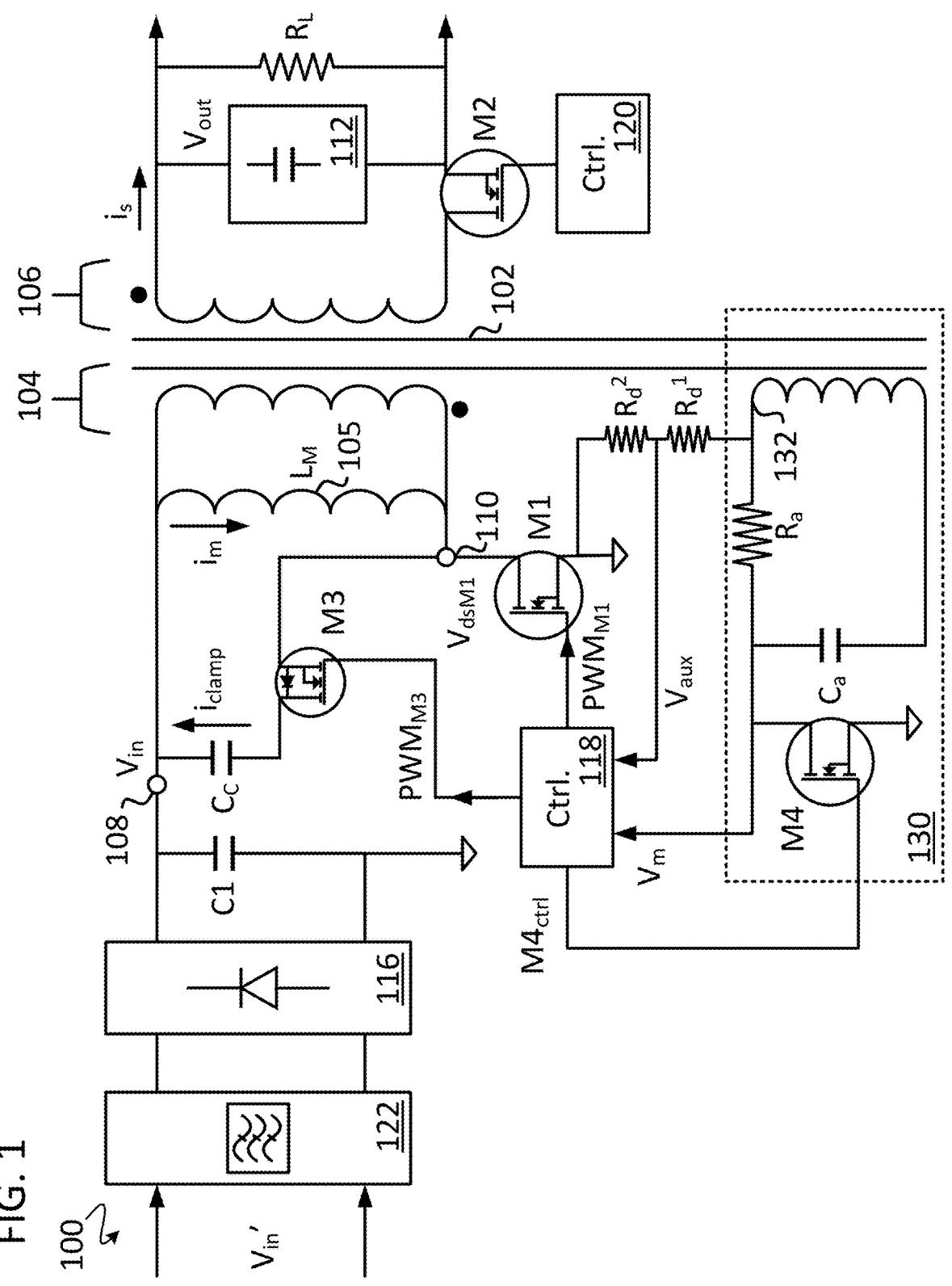
FIG. 1 is a simplified schematic of a flyback power converter having an active clamp circuit, in accordance with some embodiments.

In power converters sensitive to power losses and heat generation, energy dissipation in lossy components in the form of heat is undesirable. Recycling energy using an active clamping configuration within a power converter provides an opportunity for power converter form-factor reduction and power efficiency improvement. Active clamp circuits, as compared to resistor-capacitor-diode (RCD) snubber circuits, advantageously increase the power processing efficiency of the power converter by recycling energy stored in a leakage inductance of the power converter's transformer. Additionally, such active clamp circuits clamp a primary side peak voltage of a main switch of the power converter, which enables the power converter to utilize primary side switches having a lower voltage rating, leading to reduced power losses during switch conduction and/or switching as compared to power converters which do not use active clamping.

Active Clamp power converters often use a semiconductor switch, such as a field-effect transistor (FET), to store leakage energy in an active clamp capacitor during a portion of a switching cycle and subsequently release the energy to a load on the secondary side of the power converter. The semiconductor switch is referred to herein as an active clamp switch. A conventional way of driving the active clamp switch is to turn on the active clamp switch directly after a main switch on the primary side of the converter is turned off. The active clamp switch conventionally remains on for a duration dictated by a resonant period of a leakage current of the power converter. However, when the active clamp switch is turned on directly after the main switch is turned off, a large current spike caused by leakage energy being released from the active clamp capacitor is developed on the secondary side of the power converter. This large current spike significantly increases the RMS (root-mean-square) value of the secondary side current $i_s$. Such current spikes not only stress secondary side components of the power converter but also increase power losses by elevating the RMS of the secondary side current $i_s$. Disclosed herein is a process to reduce the RMS value of the secondary-side current $i_s$ of a flyback power converter, thereby reducing power losses for affected components, in result improving the power efficiency and reliability of the flyback converter as compared to conventional flyback converters.

Additionally, it is also often desirable to achieve zero-voltage switching (ZVS) operation (sometimes referred to as "soft-switching") for the main switch of a power converter to reduce stresses on that component. In general, ZVS is based on a critical conduction mode (CRM) of operation for the power converter. The CRM operation is a boundary condition between a continuous conduction mode (CCM) and a discontinuous conduction mode (DCM) of the power converter. In CRM, the magnetizing current $i_m$ of the power converter's transformer is allowed to fall to zero, after which the main switch of the power converter is turned on.

One conventional approach to achieve ZVS for a flyback converter is to extend the time that the active clamp switch is enabled until a sufficiently negative magnetizing current $i_m$ is developed within the transformer before enabling the main switch. The active clamp switch is enabled directly after the main switch is disabled and stays on until the main switch switches back on. One limitation of this conventional method is that the switching frequency becomes a function of ZVS, which is usually the case when a topology is operated in CRM. Another conventional approach to achieve ZVS of the main switch is by using a rectifying switch on the secondary side of the flyback converter and extending the time that the rectifying switch remains on after the magnetizing energy is depleted from the primary winding of the power converter's transformer. However, many such conventional approaches for ZVS constrain the switching frequency of the power converter and are not achievable across a wide range of loads.

Additionally, in conventional CRM operation, as the power converter's load decreases, the switching frequency of the power converter increases. An increased switching frequency may cause excessive switching losses. In addition to such switching losses, it becomes increasingly difficult to design power converters to operate at very high switching frequencies. This is because the margins are smaller, there is an increase in sensing noise, a decrease in loop stability, etc. A conventional approach that avoids high-frequency operation of CRM at light load is DCM operation with valley switching (valley skipping), but it does not provide full ZVS for the main switch. Still additionally, the controllers that drive a synchronous rectifier switch on a secondary side of power converters to achieve ZVS do not recycle leakage energy.

Disclosed herein is a process for achieving zero-voltage switching (ZVS) operation of the main switch of a flyback converter while operating the converter in burst mode across a range of loads.

Attention is initially drawn to FIG. 1 which shows a simplified circuit schematic of a flyback power converter ("power converter") 100, in accordance with some embodiments. Some elements of the power converter 100 have been omitted from FIG. 1 to simplify the description of the power converter 100 but are understood to be present. A voltage source $V_{in}'$ is received at the power converter 100. $V_{in}'$ can be provided either as an alternating current (AC) or direct current (DC). An input side of the power converter 100 generally includes an input voltage filter block 122, a rectifier block 116 (in the case of AC input), an input voltage buffer capacitor C1, an active clamp circuit that includes an active clamp capacitor $C_C$ and an active clamp switch M3 driven by a pulse-width-modulation (PWM) control signal $PWM_{M3}$, a main switch M1 driven by a PWM control signal $PWM_{M1}$, and a primary side controller circuit 118. The input voltage filter block 122, the rectifier block 116, and the input buffer capacitor C1 provide a filtered, buffered, rectified, or otherwise conditioned input voltage $V_{in}$ (i.e., a DC input voltage at a DC voltage input node) to a transformer 102.

The transformer 102 transfers power from the primary side of the power converter 100 to a secondary side of the power converter 100 and generally includes a primary winding 104 with a first terminal 108 and a second terminal 110. The output side of the power converter 100 generally includes a secondary winding 106 of the transformer 102, an output buffer circuit 112, a synchronous rectifier switch M2, a synchronous rectifier switch controller circuit 120, and is configurable to be connected to a load $R_L$.

The first terminal 108 of the primary winding 104 receives the DC input voltage $V_{in}$. The second terminal 110 of the primary winding 104 is coupled to a drain node of the main switch M1 and to the active clamp switch M3. The main switch M1 controls a magnetizing current $i_m$ through the primary winding 104 to charge a magnetizing inductance $L_M$ 105 of the transformer 102 during a first portion of a switching cycle of the power converter 100. The synchronous rectifier switch M2 controls a secondary side current flow $i_s$ through the secondary winding 106 to discharge the transformer 102 into the output buffer circuit 112 and the load $R_L$ during a subsequent portion of the switching cycle.

A resistor-capacitor (RC) divider circuit 130 includes a resistor $R_a$, an integrator capacitor $C_a$, and an integrator reset switch M4. The integrator reset switch M4 is controlled by signal $M4_{ctrl}$ for resetting an accumulated DC offset voltage at the integrator capacitor $C_a$. The RC divider circuit 130 is operable to generate a voltage $V_m$, using the auxiliary winding 132 of the transformer 102, to provide an indirect measurement of the magnetizing current $i_m$. Additionally, a resistor divider network that includes resistors $R_d^1$ and $R_d^2$ is directly connected to the auxiliary winding 132 to provide a sampled auxiliary winding voltage $V_{aux}$ to the primary side controller circuit 118.

Two or more components described herein as having nodes that are directly electrically connected have a DC current path between the respective nodes of the two or more components. For example, a first and second component are not directly electrically connected via a capacitor or inductor connected in series between the first component and the second component.

As shown in FIG. 1, a first node of the resistor Ra is directly electrically connected to a first node of the auxiliary winding 132. The integrator capacitor $C_a$ has a first node that is directly electrically connected to a second node of the resistor $R_a$ and a second node that is directly electrically connected to a second node of the auxiliary winding 132. The integrator reset switch M4 has a drain node that is directly electrically connected to the first node of the integrator capacitor $C_a$ and a source node that is directly connected to ground. A gate node of the integrator reset switch M4 is operable to be controlled by the primary side controller circuit 118 via the control signal M4$_{ctrl}$. The primary side controller circuit 118 is configured to receive a voltage V$_m$ developed at the first node of the integrator capacitor C$_a$ to generate an indirect measurement of the magnetizing current i$_m$, the voltage V$_m$ being representative of the magnetizing current i$_m$.

Also, as shown, the resistor R$_d^1$ has a first node that is directly electrically connected to the first node of the auxiliary winding 132. The resistor R$_d^2$ has a first node that is directly electrically connected to a second node of the resistor R$_d^1$ and a second node that is directly electrically connected to a source node of the main switch M1. The primary side controller circuit 118 is configured to receive an auxiliary voltage signal V$_{aux}$ from the first node of the resistor R$_d^2$. The auxiliary voltage signal V$_{aux}$ is representative of the output voltage V$_{out}$ of the power converter 100.

When the main switch M1 is enabled by the primary side controller circuit 118 during a first portion of a switching cycle of the power converter 100, current flows through the primary winding 104 to a voltage bias node such as ground. The magnetizing current flow i$_m$ through the primary winding 104 causes energy to be stored in the magnetizing inductance L$_M$ 105 and a leakage inductance L$_L$ (not shown) of the transformer 102. When the main switch M1 is disabled in a subsequent portion of the switching cycle, an output voltage V$_{out}$ is generated at the output buffer circuit 112 by the secondary side current i$_s$ and is provided to the load R$_L$. When the main switch M1 is turned off, a reflected voltage (nV$_{out}$, not shown) is developed at the primary winding 104. The contribution of the reflected voltage n V$_{out}$ to a drain-source voltage V$_{dsM1}$ of the main switch M1 at the second terminal 110 is expressed as:

$$V_{dsM1} = V_{in} + nV_{out} \qquad \text{(Equation 1)}$$

where n is a turns ratio of the transformer 102. Energy stored in the leakage inductance L$_L$ of the transformer 102 also contributes to the voltage V$_{dsM1}$ developed at the second terminal 110 and charges the active clamp capacitor C$_C$ via a resonant clamp current i$_{clamp}$. The active clamp circuit prevents the voltage V$_{dsM1}$ from increasing to a level that damages the main switch M1.

RMS Current Reduction with ZVS Operation

Figures 2A, 2B, 2C:
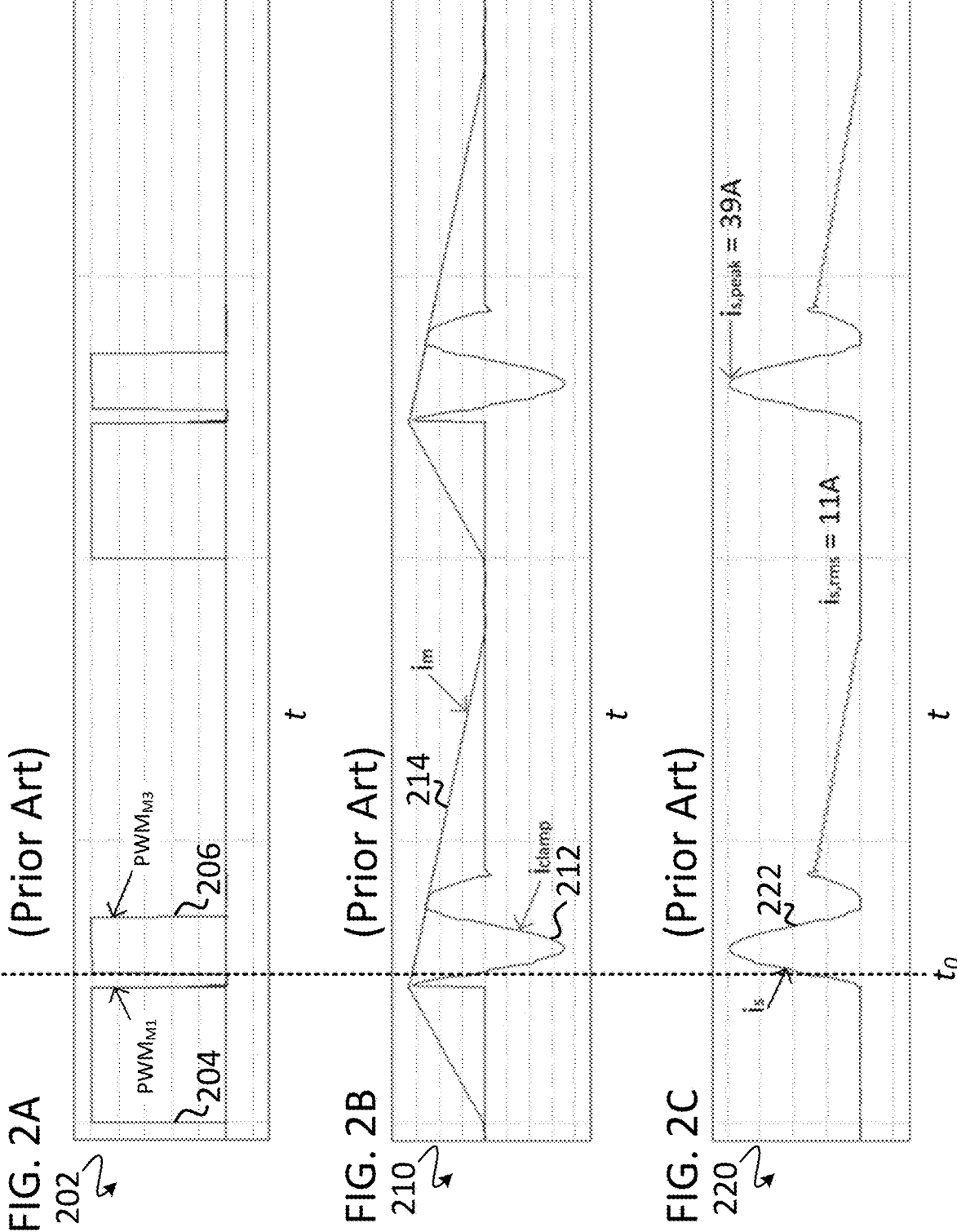

FIGS. 2A, 2B, and 2C are simplified waveforms 202, 210, and 220 illustrating the operation of the flyback converter 100 in a conventional approach where the active clamp switch M3 of the power converter 100 is enabled directly after the main switch M1 is disabled. FIG. 2A shows the main switch control signal PWM$_{M1}$ 204 and the active clamp switch control signal PWM$_{M3}$ 206 over a duration of time t. FIG. 2B shows the resonant clamp current i$_{clamp}$ 212 and the magnetizing current i$_m$ 214 over the same duration of time t. FIG. 2C shows the secondary side current i$_s$ 222 over the duration of time t.

The small delay between when the main switch control signal PWM$_{M1}$ 204 transitions from high to low and the active clamp switch control signal PWM$_{M3}$ 206 transitions from low to high is "dead-time". The dead-time may be attributed to a fixed delay that prevents simultaneous conduction of the switches M1 and M3 as well as to inherent propagation delays of the switch control signals PWM$_{M1}$ and PWM$_{M3}$. The dead-time is of arbitrary duration (conventionally 100 ns to 200 ns) and is not considered to be an auto-tuned delay between the pulses in the sense disclosed herein.

As shown in FIG. 2C, if the active clamp switch M3 is enabled directly after the main switch M1 is disabled (at time t$_0$), a large current spike caused by leakage energy being released from the clamp capacitor C$_C$ is developed on the secondary side of the power converter, which significantly increases the RMS (root-mean-square) value of the secondary side current i$_s$ 222. In the example shown, the RMS value of the secondary side current i$_s$ is 11 A, and the peak value of the secondary side current i$_s$ is 39 A. This behavior not only stresses the components on the secondary side of the power converter 100, but also increases power losses. Disclosed herein is a process that reduces RMS current on the secondary side of the power converter 100 by delaying the turn-on of the active clamp switch M3 using an auto-tuned delay based on an estimated demagnetization time of the transformer 102. This process can also advantageously provide ZVS operation for the main switch M1 of the power converter 100. By comparison, conventional solutions typically control the state of an active clamp switch based on, and coinciding with, a detected zero crossing of the magnetizing current i$_m$.

Figures 3A, 3B, 3C:
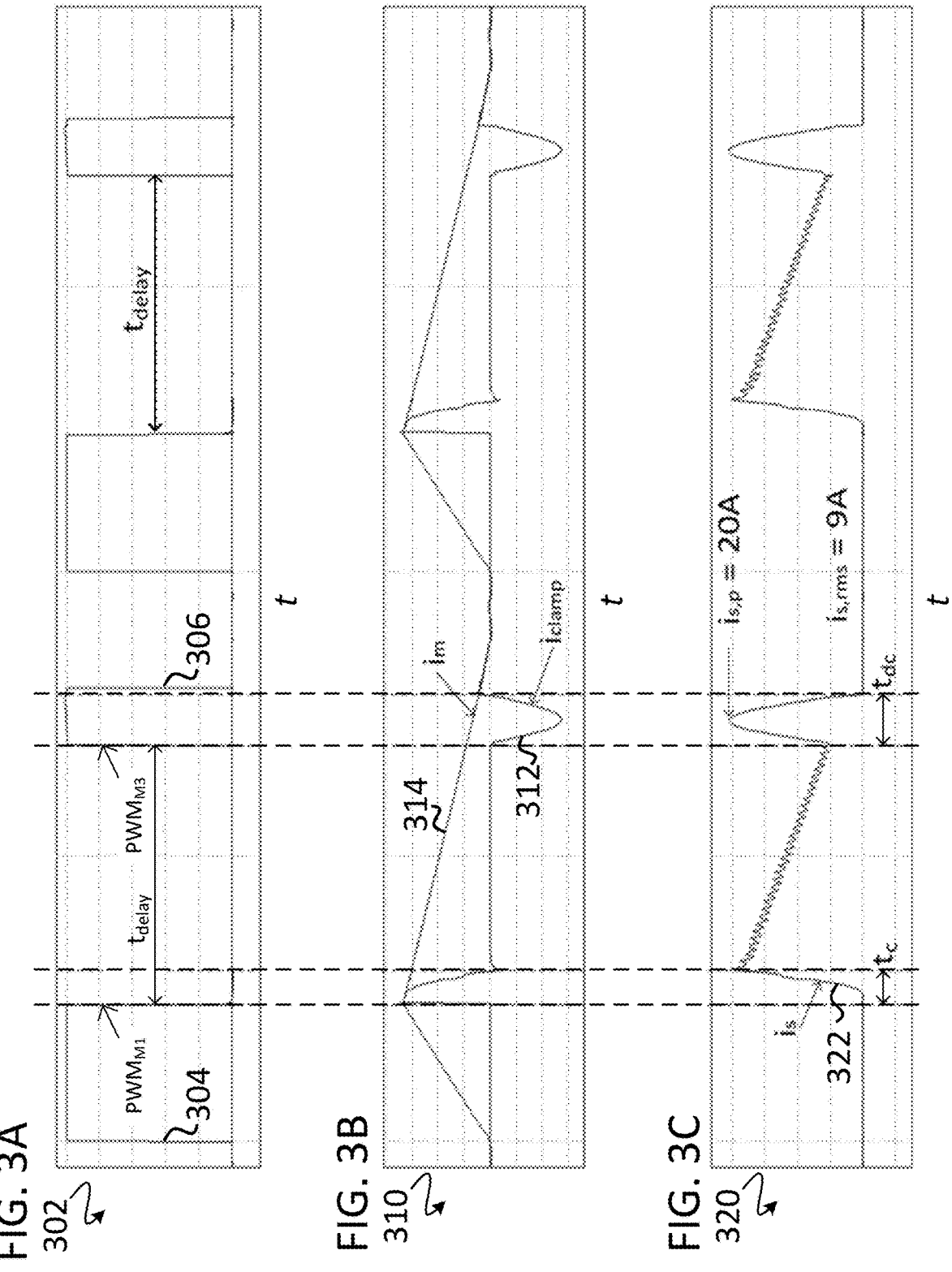

FIGS. 3A, 3B, and 3C are simplified waveforms 302, 310, and 320 illustrating the operation of the power converter 100 in an approach where enabling the active clamp switch M3 of the power converter 100 is delayed by an auto-tuned delay t$_{delay}$ after the main switch M1 is disabled, in accordance with some embodiments. The duration t$_{delay}$ is referred to herein as an "auto-tuned" delay because the delay duration may be automatically updated each switching cycle based on changes to the power converter's load, input voltage, or other changes in operational parameters.

FIG. 3A shows the main switch control signal PWM$_{M1}$ 304 and the active clamp switch control signal PWM$_{M3}$ 306 over a duration of time t. FIG. 3B shows the resonant clamp current i$_{clamp}$ 312 and the magnetizing current i$_m$ 314 over the same duration of time t. FIG. 3C shows the secondary side current i$_s$ 322 over the duration of time t.

In FIG. 3A, the active clamp control signal PWM$_{M3}$ 306 is delayed after the main switch M1 is disabled by duration t$_{delay}$. The duration t$_{delay}$ is an auto-tuned delay determined by the primary side controller circuit 118 based on an estimated demagnetization time of the transformer 102 but which occurs before a zero crossing of the magnetization current i$_m$, as compared to conventional solutions.

The leakage energy of the transformer 102 that was previously stored in the active clamp capacitor C$_C$ during an interval t$_c$ is released to the secondary side during the time t$_{dc}$. As a result of releasing the energy with an auto-tuned delay t$_{delay}$ at a later time in the switching cycle when the secondary side current i$_s$ 322 has already significantly decreased, the overall peak value of the secondary side current i$_s$ 322 is reduced from 39 A, as was shown in FIG. 2C, to 20 A, which represents a 48% reduction. The RMS value of the secondary side current i$_s$ is decreased from 11 A, as shown in FIG. 2C, to 9 A which is an 18% reduction.

As shown, one benefit of delaying emission of the active clamp switch control signal PWM$_{M3}$ after the main switch M1 is disabled is a smaller peak amplitude and RMS value of the secondary side current i$_s$, thereby reducing losses in the transformer 102 through the synchronous rectifier switch (or diode) M2 and the output buffer circuit 112, among other components. Additionally, significantly less stress on the components of the power converter 100 increases the power converter's operational lifespan and reliability.

As shown in FIG. 3A and FIG. 3B, in contrast to some conventional approaches that enable an active clamp switch upon determining or estimating that the magnetizing current $i_m$ has fallen to zero (i.e., the transformer has been demagnetized), the active clamp switch M3 is enabled well before the magnetizing current $i_m$ reaches zero. This is because, as illustrated in FIG. 3B, in many circumstances the energy discharge of the active clamp capacitor $C_C$ is completed before a zero-crossing of the magnetizing current $i_m$. Enabling the active clamp switch M3 before the magnetizing current in falls to zero provides several advantages as compared to conventional approaches. First, by enabling the active clamp switch M3 before the zero-crossing of the magnetizing current $i_m$, recycling of leakage energy is decoupled from ZVS—which starts after the magnetizing current $i_m$ is zero. Such decoupling allows the use of a larger clamp capacitor $C_C$, which is beneficial for the reduction of peak switch node voltages. If recycling leakage energy and ZVS were not decoupled, and the active clamp switch M3 is enabled at the zero-crossing of the magnetizing current $i_m$, both discharge of energy from the active clamp circuit and negative magnetizing current buildup for ZVS commence at the same time. As a result, in some scenarios, the magnetizing current $i_m$ could reach a negative amplitude that is beyond what is required for ZVS, because the on-time of the active clamp switch M3 must at least equal the discharge time of the active clamp capacitor $C_C$. If the active clamp capacitor $C_C$ is too big, the discharge would take significantly more time and force much more negative current than what is needed for ZVS, which thereby creates additional power losses.

An additional advantage of enabling the active clamp switch M3 before the magnetizing current $i_m$ falls to zero is that the secondary side synchronous rectifier switch M2 is able to stay on longer as compared to conventional approaches. While the synchronous rectifier switch M2 is enabled, the active clamp switch M3 is able to discharge through the synchronous rectifier switch M2 rather than the body diode thereof, thereby reducing power losses through the Rdson resistance of the synchronous rectifier switch M2. This is not conventionally achieved if the leakage energy is released from the active clamp capacitor $C_C$ after the magnetizing energy is completely transferred to the secondary side.

Additionally, if the active time tac that the active clamp switch M3 remains enabled is extended such that the active clamp switch M3 remains on after the magnetizing energy in the transformer 102 is fully discharged, ZVS is advantageously achieved for the main switch M1. This mode of operation is illustrated in FIGS. 4A-4C.

Figures 4A, 4B, 4C:
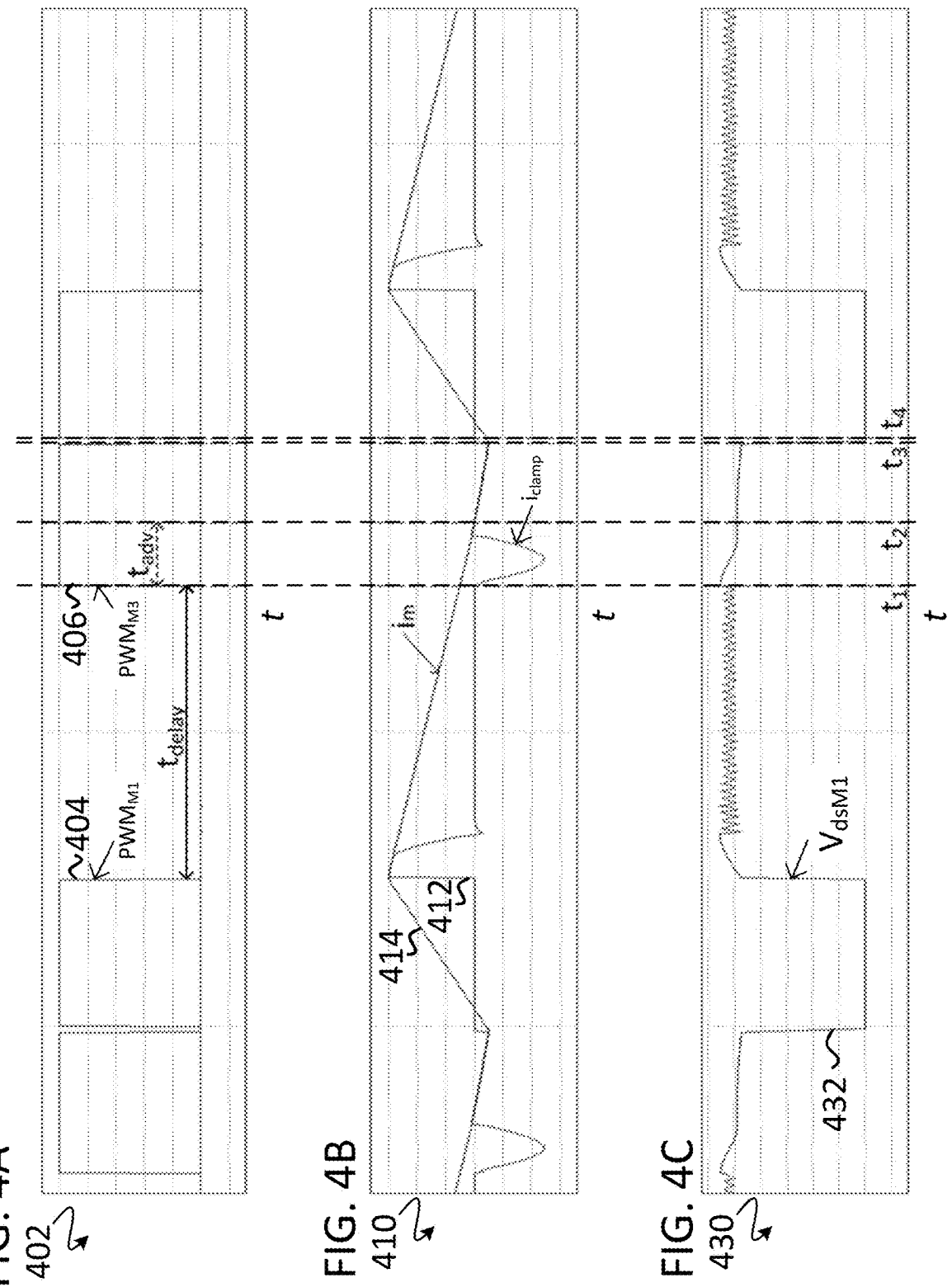

FIGS. 4A, 4B, and 4C are simplified waveforms 402, 410, and 430 illustrating the operation of the flyback converter 100 in an approach where enabling the active clamp switch M3 of the power converter 100 is delayed by an auto-tuned delay after the main switch M1 is disabled and an on-time of the active clamp switch M3 is extended, in accordance with some embodiments. FIG. 4A shows the main switch control signal $PWM_{M1}$ 404 and the active clamp switch control signal $PWM_{M3}$ 406 over a duration of time t. FIG. 4B shows the resonant clamp current $i_{clamp}$ 412 and the magnetizing current $i_m$ 414 over the same duration of time t. FIG. 4C shows the main switch drain-to-source voltage $V_{dsM1}$ 432 of the main switch M1 over the duration of time t.

At time $t_1$, after expiration of the auto-tuned delay time $t_{delay}$, the active clamp switch M3 turns on, and the energy stored in the active clamp capacitor $C_C$ is released to the secondary side of the power converter 100. This part of the operation is similar to that shown in FIGS. 3A-3C. However, when the magnetizing current $i_m$ falls below zero at time $t_2$, the magnetizing inductance $L_M$ of the transformer 102 is biased in a way that builds up the magnetizing current $i_m$ in the opposite direction. When the active clamp switch M3 turns off at time $t_3$, the magnetizing current $i_m$ continues to flow in the same direction and discharges a parasitic capacitance of the main switch M1 (not shown). As the parasitic capacitance of the main switch M1 discharges, the main switch drain-to-source voltage $V_{dsM1}$ drops to zero and the main switch M1 advantageously turns on with ZVS at time $t_4$.

As disclosed herein, the active clamp switch M3 is enabled before the zero-crossing point of the magnetizing current $i_m$ by adaptively adjusting the auto-tuned delay $t_{delay}$, which is based on an estimated time that the magnetizing current $i_m$ will reach zero Amps (i.e., a demagnetization time), as well as a user-configurable advance time $t_{adv}$. In some embodiments, the advance time $t_{adv}$ is user-configurable based on the duration of $t_{dc}$ (e.g., a percentage of the duration of $t_{dc}$, such as 10%, 25%, 50%, 75%, 100%) and can be adjusted externally through a programmable memory of the primary side controller circuit 118 (not shown) and/or a set of configuration resistors (not shown) connected to the primary side controller circuit 118. In some embodiments, the advance time $t_{adv}$ is determined as a function of the leakage inductance of the transformer 102 and the clamp capacitor $C_C$ resonant period. In such embodiments, the advance time $t_{adv}$ may be set equal to maximum expected resonant period.

As disclosed herein, the primary side controller circuit 118 determines an auto-tuned delay $t_{delay}$ between the point at which the main switch M1 is disabled and the active clamp switch M3 is enabled, $t_{delay}$ being equal to an estimated time that the magnetizing current $i_m$ will reach zero amps, minus the advance time $t_{adv}$.

Transformer Current Zero-Crossing Point Detection Using an RC Circuit

The primary side controller circuit 118 of the power converter estimates the time within a current switching cycle that the magnetizing current $i_m$ will reach zero amps based on indirect measurements of the magnetizing current $i_m$ made during a previous switching cycle of the power converter 100. To indirectly measure the magnetizing current $i_m$, a resistive-capacitive (RC) divider circuit 130 formed by resistor $R_a$ and the integrator capacitor $C_a$ connected to the auxiliary winding 132 of the transformer 102 is advantageously used, as shown in FIG. 1.

Figures 5A, 5B, 5C:
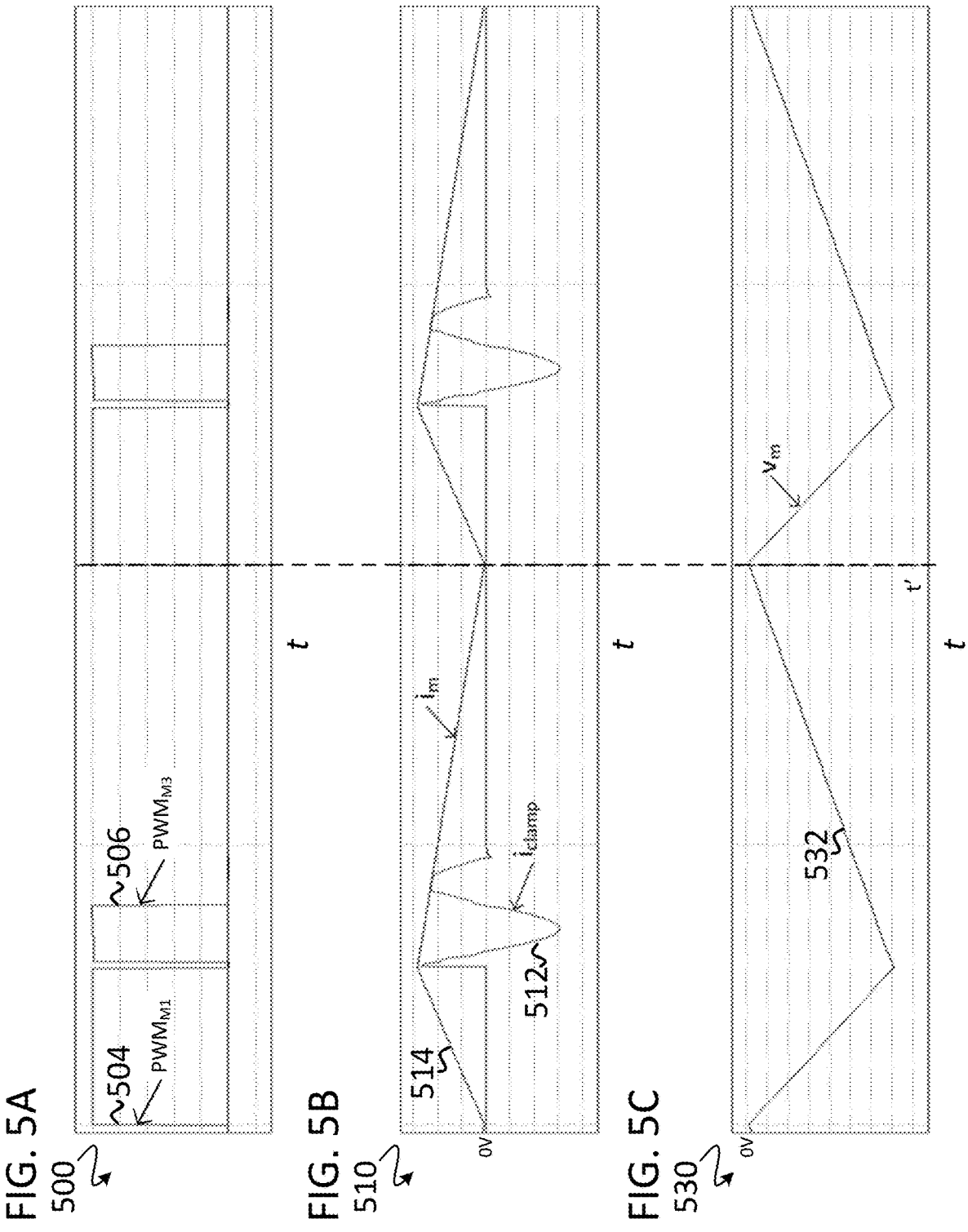

In the embodiment shown, the resistive-capacitive (RC) divider circuit 130 is operable to integrate the voltage $V_m$ developed across the auxiliary winding 132 to produce the magnetizing current $i_m$ waveform by approximation. FIGS. 5A, 5B, and 5C are simplified waveforms 500, 510, and 530 illustrating the operation of the flyback converter 100 when the voltage $V_m$ is integrated to approximate a magnetizing current $i_m$ waveform, in accordance with some embodiments.

FIG. 5A shows the main switch control signal $PWM_{M1}$ 504 and the active clamp switch control signal $PWM_{M3}$ 506 over a duration of time t. FIG. 5B shows the resonant clamp current $i_{clamp}$ 512 and the magnetizing current $i_m$ 514 over the same duration of time t. FIG. 5C shows the integrated voltage $V_m$ over time t. As shown in FIG. 5C, the voltage $V_m$ waveform 532 is an inverted representation of the magnetizing current $i_m$ waveform 514. At time t', both waveforms $i_m$ 514 and $V_m$ 532 are at a zero value.

Figure 5D:
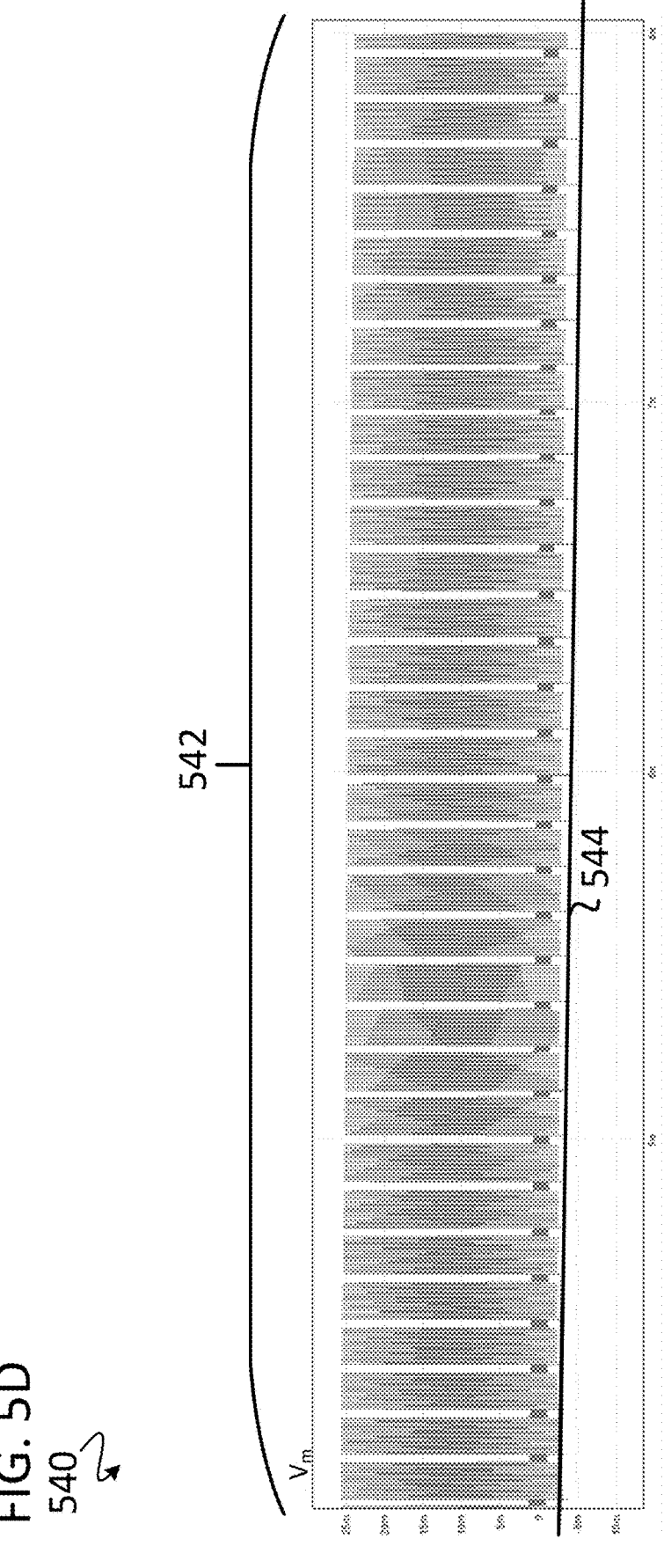
Figure 5E:
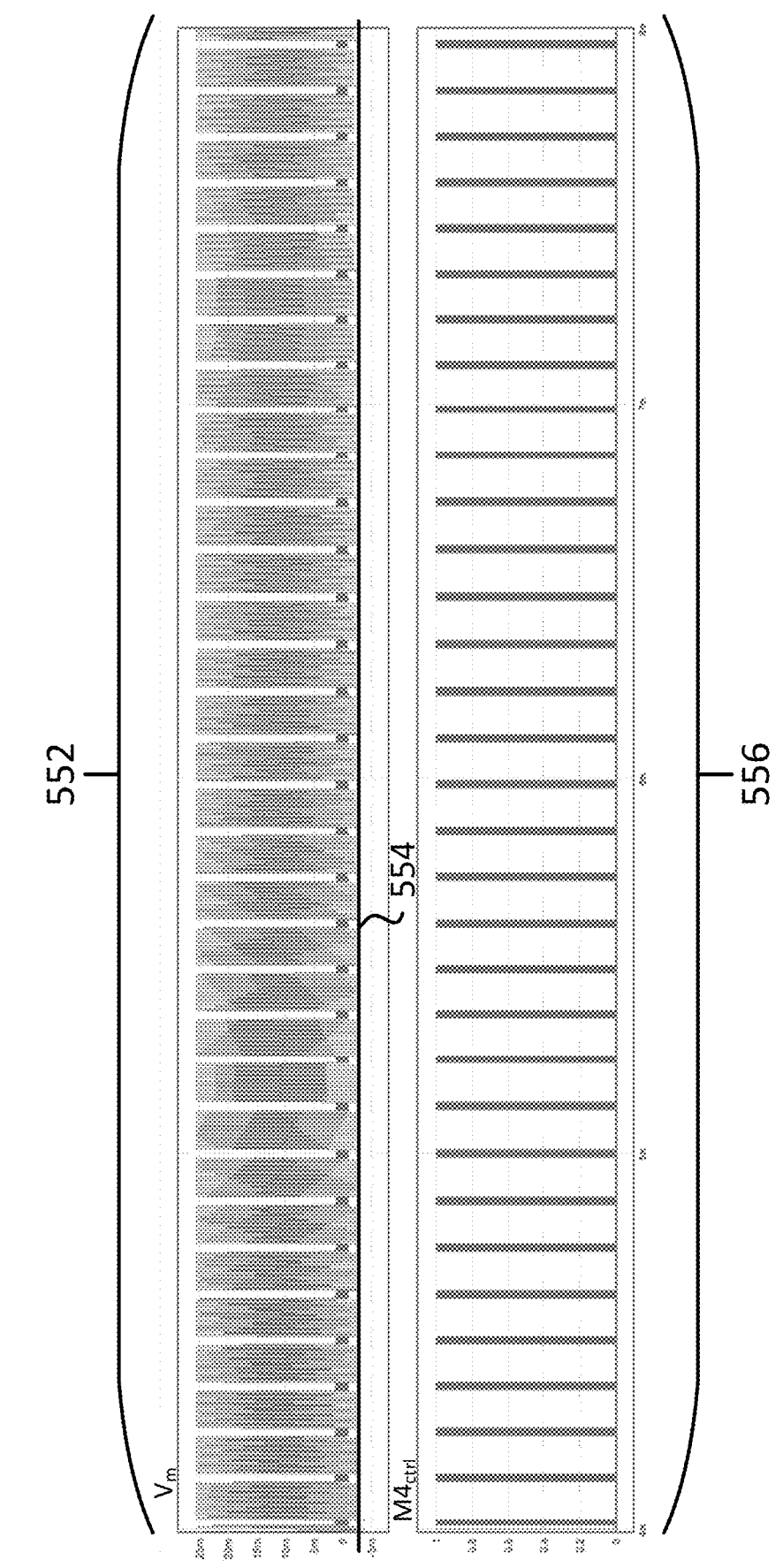

In accordance with some embodiments, the primary side controller circuit 118 uses the integrator reset switch M4 to provide an integrator reset for the RC divider circuit 130, thereby mitigating voltage drift. For example, with reference to FIG. 5D, a simplified graph 540 shows the voltage $V_m$ 542 over multiple switching cycles of the flyback converter 100. As illustrated by an annotation 544, a voltage envelope of the voltage $V_m$ 542 drifts over time as a DC offset voltage at the RC divider circuit 130 accumulates. Thus, in some embodiments, the integrator reset switch M4 is selectively enabled by the primary side controller circuit 118 to discharge the capacitor $C_a$. By comparison, FIG. 5E shows a simplified graph 550 that includes the voltage $V_m$ 552 over multiple switching cycles of the flyback converter 100 and the control signal $M4_{ctrl}$ 556 issued to the integrator reset switch M4 by the primary side controller circuit 118. As illustrated by an annotation 554, a voltage envelope of the voltage $V_m$ 552 is relatively constant over time as a DC offset voltage at the resistive-capacitive (RC) divider circuit 130 is not allowed to accumulate.

In some embodiments, the primary side controller circuit 118 enables the integrator reset switch M4 based on detected quasi-resonant (QR) oscillations during a burst wait time (i.e., between the burst pulses) and resets (discharges) the integrator capacitor $C_a$ in the RC integrator when the magnetizing current $i_m$ is equal to zero (i.e., a peak of a valley voltage of the QR oscillations), ensuring that it always starts the next switching pulse with zero offset.

Figure 5F:
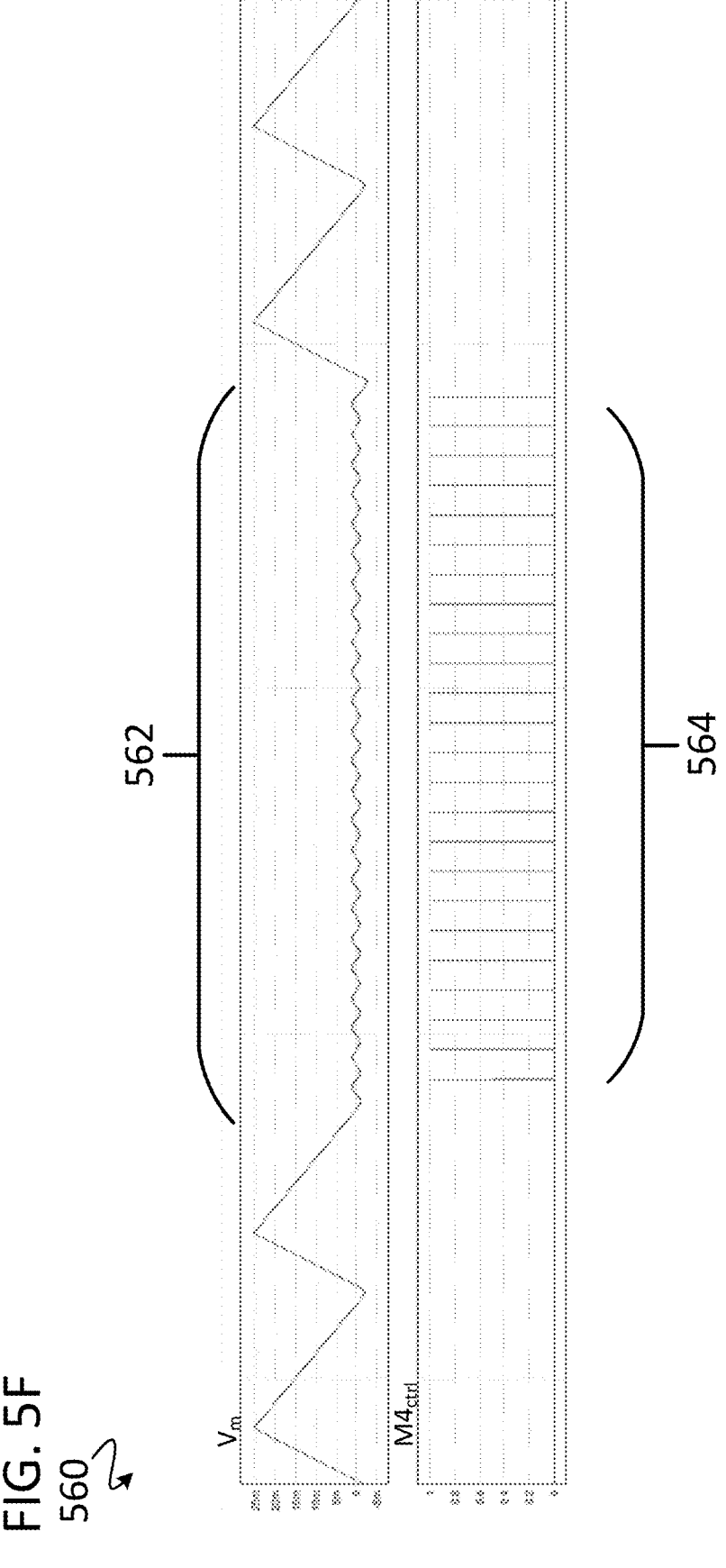

For example, a simplified graph 560 shown in FIG. 5F illustrates a series of control pulses $M4_{ctrl}$ 564 each time that the magnetizing current $i_m$ reaches zero volts during QR oscillations over the duration 562.

In case of full-load operation of the flyback converter 100 with continuous pulses, at approximately every 100 us (or another appropriate interval), the primary side controller circuit 118 is operable to skip one switching pulse to create a QR zone and thus the opportunity to discharge the integrator capacitor $C_a$. That is, there must be a short amount of time during which the magnetizing current $i_m$ is zero. In other words, the flyback converter 100 briefly enters DCM (burst mode), even at full power, to be able to reset the integrator and remove any offset accumulation. In some embodiments, the RC divider circuit 130 is integrated within the primary side controller circuit 118. In other embodiments, the RC divider circuit 130 is external to the primary side controller circuit 118.

Transformer Current Demagnetization Time Estimator

When the power converter 100 is operated at fixed minimum and maximum current limits, designated respectively as $I_{peak}^{min}$ and $I_{peak}^{max}$, the demagnetization time of the transformer 102, designated as $t_{demag}$ is known or easily calculated by the power converter 100 by simple scaling. However, for pulses with a fractional current value that falls anywhere between the minimum current value $I_{peak}^{min}$ and the maximum current value $I_{peak}^{max}$, the demagnetization time $t_{demag}$ cannot be simply scaled and must be accurately estimated to determine the auto-tuned delay $t_{delay}$.

The reason that the demagnetization time $t_{demag}$ must be accurately predicted is that, as disclosed above, the active clamp switch M3 is advantageously turned on before the zero-crossing point of the magnetizing current $i_m$. Thus, the control employed by the primary side controller circuit 118 must be predictive in a sense. For instance, if the switching pattern in one switching cycle of the power converter 100 is significantly different from a previous cycle, while still operating with fractional current, the new demagnetization time $t_{demag}$ must be estimated by the primary side controller circuit 118 in order to correctly anticipate when to turn on the active clamp switch M3.

Figure 6:
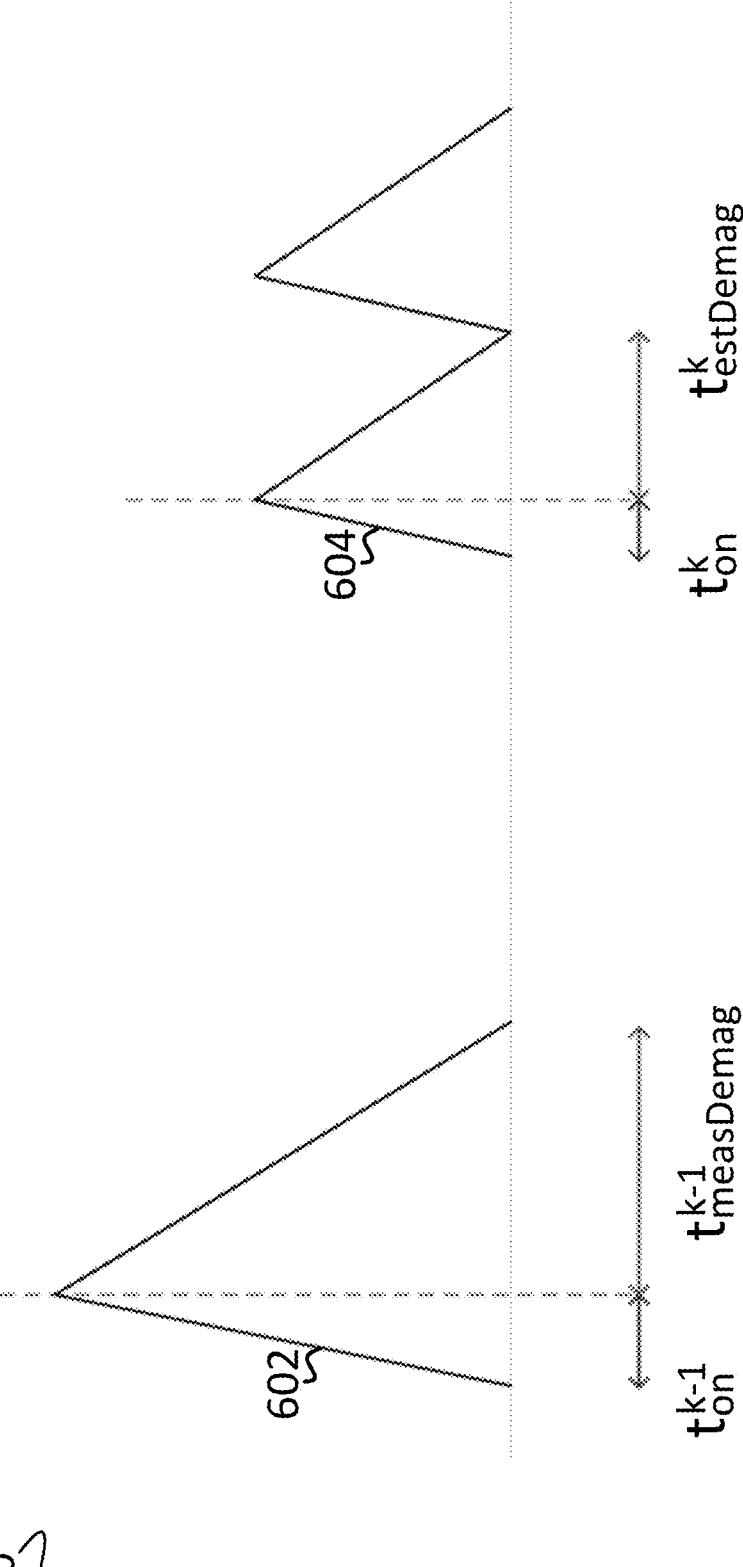

In accordance with some embodiments, a method for estimating the demagnetization time of the transformer 102 is illustrated in a simplified graph 600 shown in FIG. 6, and is elaborated upon in FIG. 7. The method implemented by the primary side controller circuit 118 determines and stores both the on-time of the main switch M1, designated as $t_{on}$, and the demagnetization time $t_{demag}$ values from a previous switching cycle, designated as $$t_{on}^{k-1} \text{ and } t_{measDemag}^{k-1}$$

in the graph 600. The value of $$t_{measDemag}^{k-1}$$

from a previous switching cycle 602 is not estimated, but is measured indirectly using the RC divider circuit 130 which generates a voltage $V_m$ that is representative of the magnetizing current $i_m$. The time it takes from a point in time that the main switch M1 is switched off until the magnetizing current $i_m$ reaches 0 Amps is the demagnetization time.

The value of $t_{on}^{k-1}$ from the previous switching cycle 602 is known, easily stored and available because the primary side controller circuit 118 determines the $t_{on}$ time for the main switch M1. In a subsequent switching cycle 604 for which $$t_{estDemag}^{k}$$

is estimated by the primary side controller circuit 118, the value of $t_{on}$ is also known after the main switch M1 is switched off. Therefore, the new $$t_{estDemag}^{k}$$

for the subsequent switching cycle is estimated as:

$$t_{estDemag}^{k} = \left( \frac{t_{on}^{k}}{t_{on}^{k-1}} \right) \times t_{measDemag}^{k-1} \qquad \text{(Equation 2)}$$

Additionally, if the output voltage changes significantly from one switching cycle to another, it is advantageous to compensate for the above equation to include the voltage difference. This can be done through the use of the output voltage $V_{aux}$ of the auxiliary winding 132 since only a relative difference in voltage is required. In such embodiments, the primary side controller circuit 118 continuously samples the output voltage $V_{aux}$ of the auxiliary winding 132 using the resistor divider circuit that includes resistors $R_d^1$ and $R_d^2$ and stores the $V_{aux}$ value from the previous switching cycle. The new equation that adds compensation using the $V_{aux}$ voltage is:

$$t_{estDemag}^k = \left(\frac{t_{on}^k}{t_{on}^{k-1}}\right) \times t_{measDemag}^{k-1} \times \left(\frac{V_{aux}^{k-1}}{V_{aux}^k}\right). \quad \text{(Equation 3)}$$

As described with reference to FIG. 7, either of the estimated demagnetization values $$t_{estDemag}^k$$

shown in Equation 2 and Equation 3 is advantageously used in combination with the configurable advance time $t_{adv}$ described above to determine the auto-tuned delay $t_{delay}$ value, which is the amount of time that the primary side controller circuit 118 waits between turning off the main switch M1 and turning on the active clamp switch M3. As such, the auto-tuned delay $t_{delay}$ value for the $k^{th}$ switching cycle may be expressed as:

$$t_{delay}^k = t_{estDemag}^k - t_{adv}. \quad \text{(Equation 4)}$$

FIG. 7 shows a simplified portion of a process 700 for determining an auto-tuned delay for an active clamp switch of a power converter, in accordance with some embodiments. The particular steps, order of steps, and combination of steps are shown for illustrative and explanatory purposes only. Other embodiments can implement different particular steps, orders of steps, and combinations of steps to achieve similar functions or results.

At step 702, a first on-time $$t_{on}^{k-1}$$

of the main switch M1 of the power converter 100 is identified by the primary side controller circuit 118 for a first switching cycle of the power converter 100. Because the primary side controller circuit 118 controls the main switch M1, the on-time $t_{on}$ of the main switch M1 is a readily available parameter to the controller circuit. At step 704, a demagnetization time $$t_{measDemag}^{k-1}$$

of the transformer 102 is determined by the primary side controller circuit 118 during the first switching cycle. In some embodiments, the primary side controller circuit 118 determines the demagnetization time $$t_{measDemag}^{k-1}$$

based on the reconstructed representation of the magnetizing current $i_m$ generated using the RC divider circuit 130 connected to the auxiliary winding 132. At step 706, a second on-time $$t_{on}^k$$

of the main switch M1 of the power converter 100 is identified by the primary side controller circuit 118 during a second switching cycle of the power converter 100. At step 708, the primary side controller circuit 118 calculates an estimated demagnetization time $$t_{estDemag}^k$$

of the transformer 102 using either Equation 2 or Equation 3 as described above with the input values determined at steps 702-706. At step 710, the primary side controller circuit 118 identifies a previously configured advance time $t_{adv}$, as described above. At step 712, the primary side controller circuit 118 determines an auto-tuned delay time $t_{delay}$ by subtracting the identified advance time $t_{adv}$ from the estimated demagnetization time $$t_{estDemag}^k$$

as shown in Equation 4 above. At step 714, after turning off the main switch M1 during the second switching cycle, the primary side controller circuit 118 turns on the active clamp switch M3 after waiting for a duration equal to the auto-tuned delay time $t_{delay}$.

Equivalent Charge Burst Mode PWM Control

In order for the auto-tuned delay control method of the power converter 100 disclosed above to be applicable across a range of loads connected to the power converter 100, and to decouple the switching frequency of the power converter 100 from ZVS operation, a burst mode of operation is disclosed herein for light and medium-heavy loads. The burst frequency is several times lower than the maximum switching frequency of the power converter 100. The number of pulses of the main switch M1 during a burst period varies based on the load connected to the power converter 100 and is limited by design constraints of the power converter 100 and the selected burst frequency.

Figures 8A, 8B:
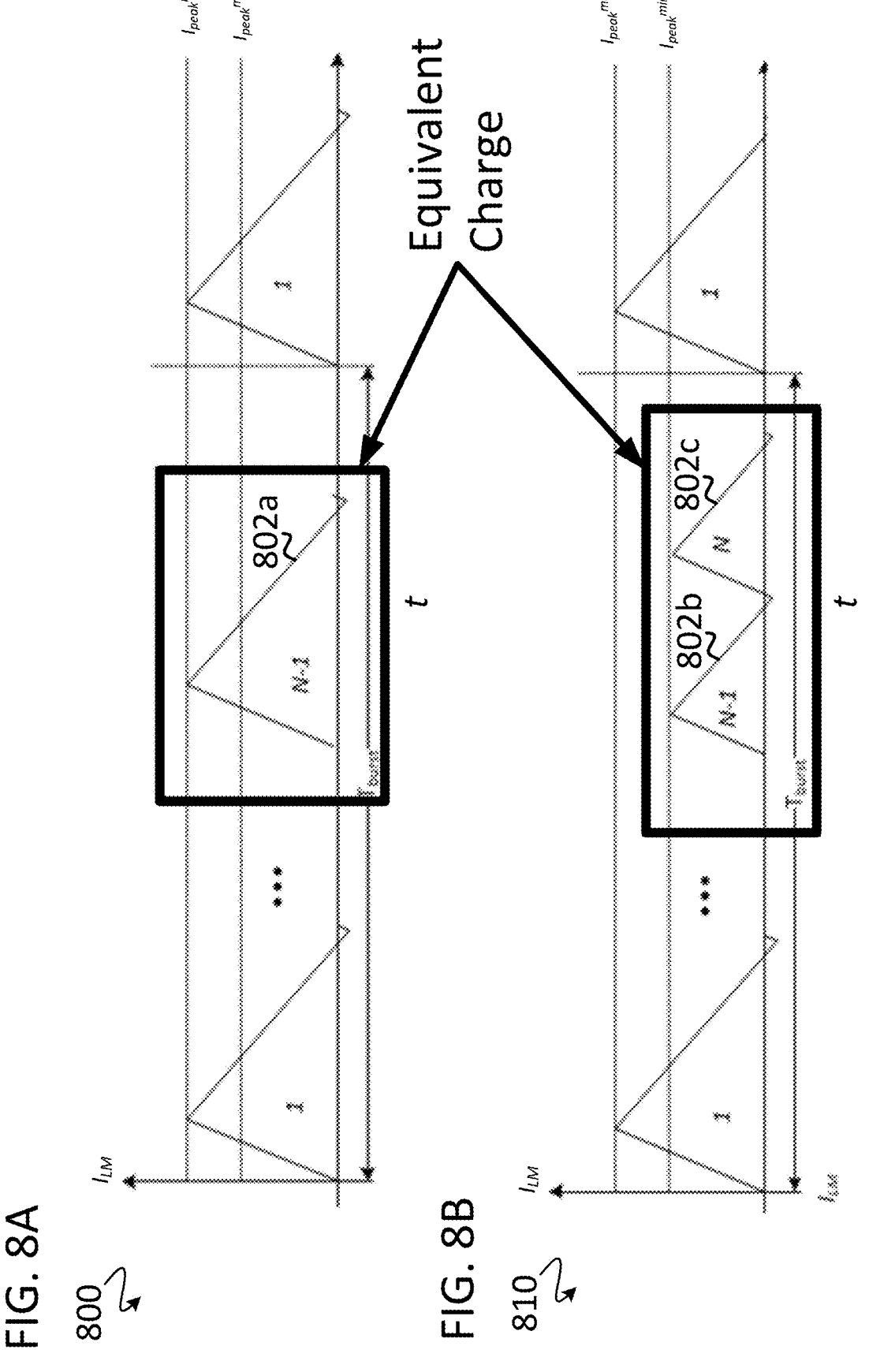

Operation of the power converter 100 with n number of magnetizing current pulses is presented in FIGS. 8A-8B, in accordance with some embodiments. FIGS. 8A-8B provide simplified plots 800 and 810 of magnetizing current $i_m$ pulses 802a-c over time t.

In the examples shown, the valid range for the magnetizing current $i_m$ is limited between the minimum current value $I_{peak}^{min}$ (a minimum current threshold value) and the maximum current value $I_{peak}^{max}$ (a maximum current threshold value). The current values $I_{peak}^{min}$ and $I_{peak}^{max}$ form an operational band for the transformer magnetizing current $i_m$ in which the main switch M1 is allowed to turn off to achieve ZVS of the main switch M1 and to minimize RMS current on the secondary side of the power converter 100. This principle is followed whenever the total number of pulses in a burst period is higher than one. If the power converter 100 operates with only one pulse in the burst period, the magnetizing current $i_m$ is allowed to vary freely based on the load, the maximum current still being the value of $I_{peak}^{max}$, while the minimum $I_{peak}^{min}$ is defined by the shortest allowed $t_{on}$ time for the main switch M1. During operation of the power converter 100 with an extremely light load, when a single pulse with the smallest on-time $t_{on}$ of the main switch M1 still transfers too much energy to the secondary side of the power converter, the burst frequency is allowed to be decreased in order to keep the output voltage in regulation.

As disclosed herein, this control method is based on the equivalent charge principle. At a high level, the charge transferred to the secondary side of the power converter 100 from a single large pulse (802a shown in FIG. 8A) with a peak current value of $I_{peak}^{max}$ is equivalent to the combined charge of two smaller pulses (802b-c shown in FIG. 8B) with a peak value of $I_{peak}^{min}$ (each being $\sqrt{2}$ times smaller than $I_{peak}^{max}$). This principle advantageously allows for pulse splitting or merging. For example, if the load of the power converter 100 is increasing, upon determining that the amplitude of a single current pulse has reached or surpassed the $I_{peak}^{max}$ value, control of the main switch control signal $PWM_{M1}$ is adjusted by the primary side controller circuit such that two pulses are generated having peak amplitudes that are equal to $I_{peak}^{min}$ (i.e., each being $\sqrt{2}$ times smaller than $I_{peak}^{max}$).

As described below, the timing of the main switch control signal $PWM_{M1}$ is adjusted thereafter such that the amplitude of each newly created current pulse is then separately increased with fine precision until the amplitude thereof reaches $I_{peak}^{max}$. The last pulse of a switching sequence is then once again split into two new pulses by adjusting a timing of the main switch control signal $PWM_{M1}$ and the process continues until the entire burst period is filled with pulses. In some embodiments, only one pulse in the burst period is fine-tuned at one time. In other words, only one pulse of a pulse sequence is permitted to reach any fractional current value between the $I_{peak}^{min}$ and $I_{peak}^{max}$ limits. This fractional control is what allows for fine regulation of output voltage and ripple reduction.

The pulse splitting and merging control method of the main switch M1, as controlled by the primary side controller circuit 118, disclosed herein has several key benefits when compared to conventional burst mode operation. First, the output voltage ripple of the power converter 100 is advantageously reduced by controlling the magnetizing current $i_m$ in a tight band. Second, the dynamic response of the power converter 100 is better than that of a conventional design. Third, the effective switching frequency of the power converter is greatly reduced by forcing the current to stay above the lower limit of $I_{peak}^{min}$.

Figures 9A, 9B:
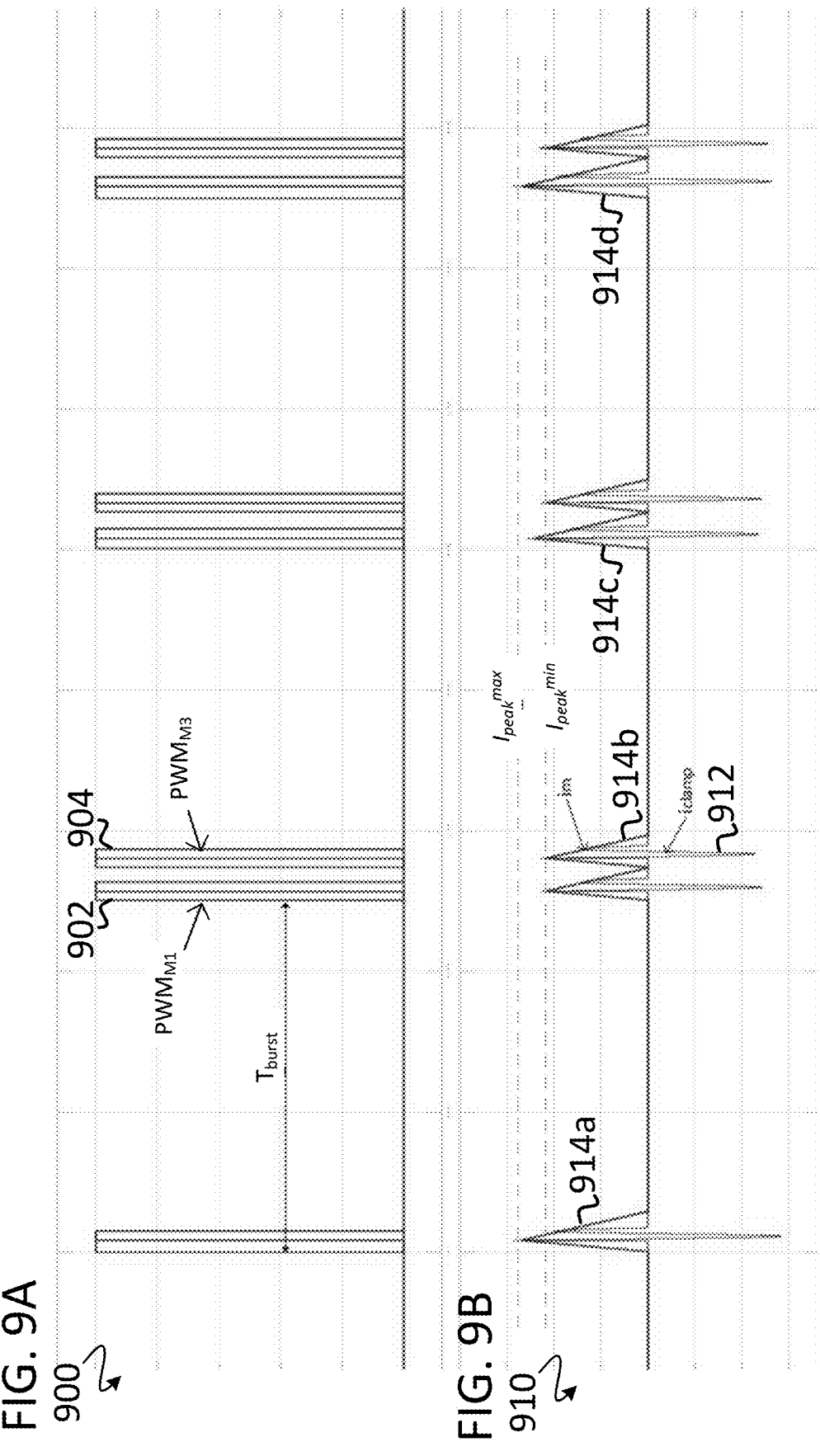

Further details are provided in FIGS. 9A-9B and FIGS. 10A-10B, in accordance with some embodiments. FIG. 9A provides a simplified graph 900 of the main switch control signal $PWM_{M1}$ 902 and the active clamp switch control signal $PWM_{M3}$ 904, and FIG. 9B provides a simplified graph 910 of the resonant clamp current $i_{clamp}$ 912 and the magnetizing current $i_m$ peaks 914a-d. As illustrated in FIGS. 9A and 9B, as the load of the power converter 100 increases, more energy is required to be delivered from the primary side of the power converter 100 to the secondary side thereof. There are three complete burst periods shown in FIGS. 9A and 9B. A first burst period is labeled "$T_{burst}$". Upon determining by the primary side controller circuit 118 that the magnetizing current $i_m$ of the pulse 914a has reached the peak value $I_{peak}^{max}$, two pulses 914b with a lower peak value equal to $I_{peak}^{min}$ are generated by the primary side controller circuit 118 in the next burst period. However, the amount of energy delivered to the secondary side of the power converter 100 advantageously remains the same as compared to the previous switching cycle. Next, one of the two newly created pulses 914c is increased by the primary side controller circuit 118 to its peak value. When $I_{peak}^{max}$ is reached at pulse 914d, the same process is performed on the other pulse (not shown). Once both pulses are at $I_{peak}^{max}$, the last pulse will split again and there will be three pulses in total: one at $I_{peak}^{max}$ and two pulses at $I_{peak}^{min}$ (not shown).

Figures 10A, 10B:
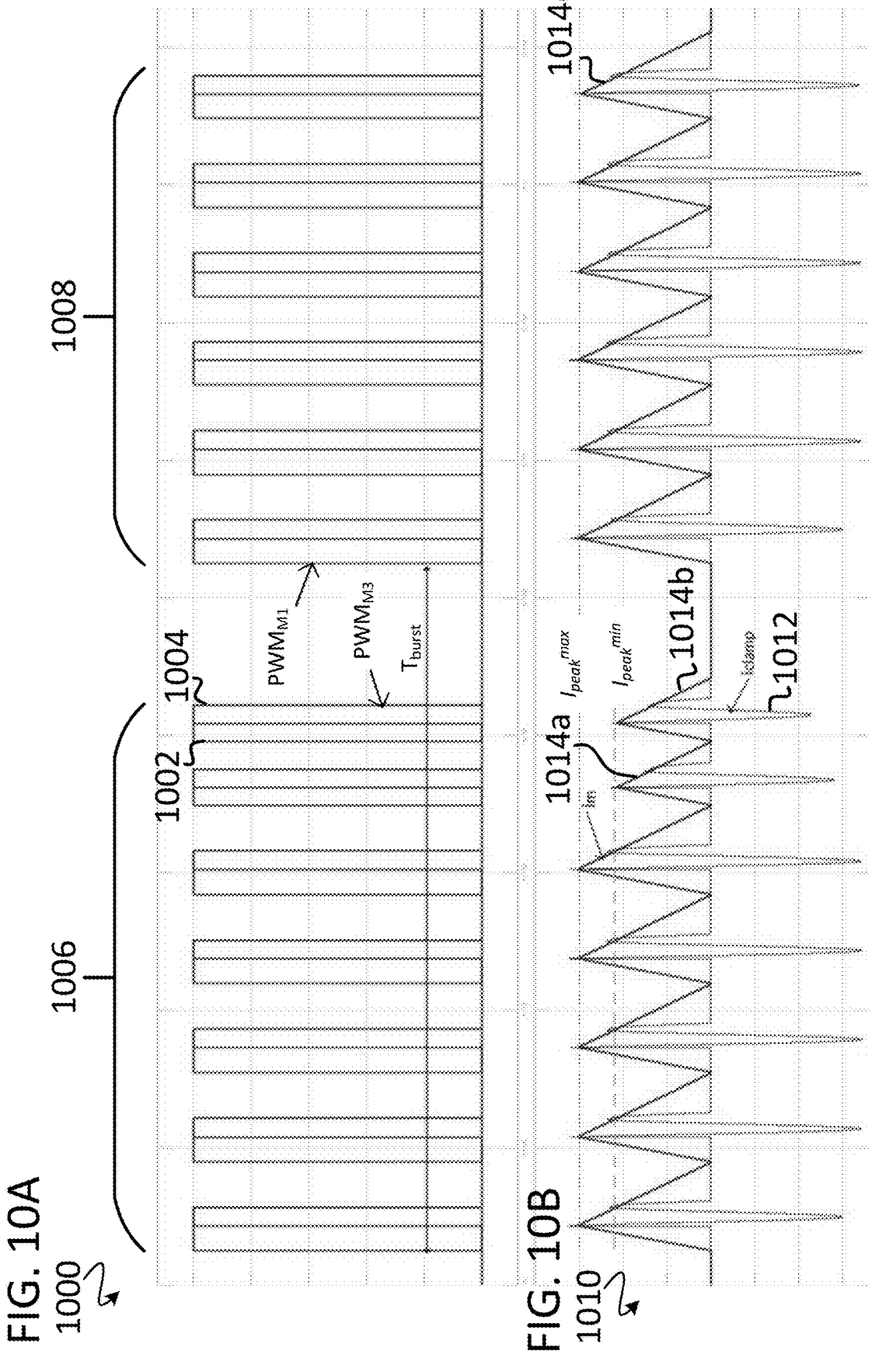

FIGS. 10A and 10B provide an example with a decreasing load of the power converter 100, in accordance with some embodiments. FIG. 10A provides a simplified graph 1000 of the main switch control signal $PWM_{M1}$ 1002 and the active clamp switch control signal $PWM_{M3}$ 1004 immediately following each main switch control signal $PWM_{M1}$ 1002, and FIG. 10B provides a simplified graph 1010 of the resonant clamp current $i_{clamp}$ 1012 and the magnetizing current $i_m$ peaks 1014a-c. The graphs 1000 and 1010 illustrate two complete burst periods 1006 and 1008. The burst period 1006 includes seven pulses—the first five of which correspond to magnetizing current $i_m$ peak amplitudes of $I_{peak}^{max}$ and the last two of which, 1014a-b, correspond to magnetizing current $i_m$ peak amplitudes of $I_{peak}^{min}$. As the load of the power converter 100 decreases, the last two magnetizing current pulses in 1014a-b are combined into a single pulse 1014c having an amplitude of $I_{peak}^{max}$ during the subsequent burst period 1008. The burst period 1008 contains six pulses corresponding to magnetizing current $i_m$ peak amplitudes of $I_{peak}^{max}$, but the amount of energy delivered to the secondary side of the power converter 100 remains the same. As such, the foregoing transition advantageously does not negatively affect the ripple on Vout of the power converter 100. As the load decreases further, the last pulse will decrease from $I_{peak}^{max}$ to $I_{peak}^{min}$, followed by a pulse next to it doing the same (not shown). Finally, there will be six pulses again but now four will have magnetizing current $i_m$ peak amplitudes at $I_{peak}^{max}$ and two will have magnetizing current $i_m$ peak amplitudes at $I_{peak}^{min}$ (not shown). At this point, the last two pulses will merge, forming five pulses having magnetizing current $i_m$ peak amplitudes at $I_{peak}^{max}$ (now shown).

Reference has been made in detail to embodiments of the disclosed invention, one or more examples of which have been illustrated in the accompanying figures. Each example has been provided by way of an explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A power converter comprising:
   a transformer having a primary winding and a secondary winding, a first winding node of the primary winding being configured to be coupled to a voltage source to receive an input voltage, the secondary winding being configured to be coupled to a load to provide an output voltage from the input voltage;

a main switch coupled to a second winding node of the primary winding to control a magnetizing current through the primary winding;

an active clamp circuit comprising:

an active clamp switch; and an active clamp capacitor coupled in a series circuit combination with the active clamp switch; and a primary side controller circuit configured to control the main switch;

wherein the primary side controller circuit is configured to:

indirectly measure the magnetizing current during a first switching cycle of the power converter;

estimate a zero-crossing point of the magnetizing current of the transformer for a second switching cycle based on the indirect primary side measurement of the magnetizing current during the first switching cycle;

generate an auto-tuned delay for the second switching cycle between disabling the main switch and enabling the active clamp switch before the zero-crossing of the magnetizing current occurs in the second switching cycle, the auto-tuned delay being based on the estimated zero-crossing point; and enable the active clamp switch during the second switching cycle in accordance with the auto-tuned delay.

2. The power converter of claim 1, wherein estimating the zero-crossing point of the magnetizing current comprises:

identifying a first on-time of the main switch during the first switching cycle;

determining a measured demagnetization time of the transformer during the first switching cycle using the indirectly measured magnetizing current;

identifying a second on-time of the main switch during the second switching cycle; and calculating an estimated demagnetization time of the transformer for the second switching cycle to estimate the zero-crossing point of the magnetizing current using the first on-time, the second on-time, and the measured demagnetization time.

3. The power converter of claim 2, wherein generating the auto-tuned delay comprises:

identifying a configured advance time for enabling the active clamp switch for the second switching cycle; and determining the auto-tuned delay by subtracting the advance time from the estimated demagnetization time.

4. The power converter of claim 3, wherein:

upon turning off the main switch during the second switching cycle, the active clamp switch is enabled after the auto-tuned delay has expired.

5. The power converter of claim 2, wherein calculating the estimated demagnetization time comprises:

generating a ratio of the second on-time to the first on-time;

generating a first product of the measured demagnetization time and the ratio of the second on-time of the main switch to the first on-time of the main switch; and determining the estimated demagnetization time using the first product.

6. The power converter of claim 5, further comprising:

measuring a first voltage representative of the output voltage of the power converter during the first switching cycle;

measuring a second voltage representative of the output voltage of the power converter during the second switching cycle;

generating a ratio of the first voltage to the second voltage; and generating a second product of the first product and the ratio of the first voltage to the second voltage, the second product being used as the estimated demagnetization time.

7. The power converter of claim 1, further comprising:

an auxiliary winding of the transformer; and a resistor-capacitor (RC) divider circuit coupled to the auxiliary winding, the RC divider circuit comprising:

a first resistor having a first node directly electrically connected to a first node of the auxiliary winding;

an integrator capacitor having a first node directly electrically connected to a second node of the first resistor and a second node directly electrically connected to a second node of the auxiliary winding; and an integrator reset switch having a drain node directly electrically connected to the first node of the integrator capacitor and a source node directly connected to ground, the integrator reset switch being controlled by the primary side controller circuit;

wherein the primary side controller circuit is configured to receive a voltage developed at the first node of the integrator capacitor to generate the indirect measurement of the magnetizing current, the voltage developed at the first node of the integrator capacitor being representative of the magnetizing current.

8. The power converter of claim 7, wherein:

the integrator reset switch is operable to reset an accumulated DC offset voltage at the first node of the integrator capacitor.

9. The power converter of claim 8, wherein:

the primary side controller circuit is configured to detect quasi-resonant (QR) oscillations of a voltage at the auxiliary winding; and enable the integrator reset switch based on the QR oscillations.

10. The power converter of claim 7, further comprising:

a resistor-divider network coupled to the auxiliary winding, the resistor-divider network comprising:

a second resistor having a first node directly electrically connected to a first node of the auxiliary winding; and a third resistor having a first node directly electrically connected to a second node of the second resistor and a second node directly electrically connected to a source node of the main switch;

wherein the primary side controller circuit is configured to receive an auxiliary voltage signal from the first node of the third resistor, the auxiliary voltage signal being representative of the output voltage of the power converter.

11. The power converter of claim 1, further comprising:

upon determining, by the primary side controller circuit, that a peak current amplitude of a first magnetizing current pulse of the magnetizing current has surpassed a maximum current threshold value during the first switching cycle of the power converter, issuing second and third magnetizing current pulses in the second switching cycle of the power converter, a first amount of charge delivered to the load of the power converter by the first magnetizing current pulse being equal to a second amount of charge delivered to the load of the power converter by the combined second and third magnetizing current pulses.

12. The power converter of claim 1, further comprising:

upon determining, by the primary side controller circuit, that respective peak current amplitudes of two first magnetizing current pulses of the magnetizing current are both less than a minimum current value threshold value during the first switching cycle of the power converter, issuing a single second magnetizing current pulse in a second switching cycle of the power converter, a first amount of charge delivered to the load of the power converter by the combined two first magnetizing current pulses being equal to a second amount of charge delivered to the load of the power converter by the second magnetizing current pulse.

13. A power converter comprising:

a transformer having a primary winding and a secondary winding, a first winding node of the primary winding being configured to be coupled to a voltage source to receive an input voltage, the secondary winding being configured to be coupled to a load to provide an output voltage from the input voltage;

a main switch coupled to a second winding node of the primary winding to control a magnetizing current through the primary winding;

an active clamp circuit comprising:

an active clamp switch; and an active clamp capacitor coupled in a series circuit combination with the active clamp switch; and a primary side controller circuit configured to control the main switch;

wherein the primary side controller circuit is configured to:

indirectly measure the magnetizing current during a first switching cycle of the power converter; and upon determining that a peak current amplitude of one or more first magnetizing current pulses of the magnetizing current during the first switching cycle is greater than a maximum current threshold value or is less than a minimum current threshold value for a first number of magnetizing current pulses, issuing a second number of one or more second magnetizing current pulses in a second switching cycle, the second number of magnetizing current pulses being different than the first number of magnetizing current pulses;

wherein:

a first amount of charge delivered to the load of the power converter by the one or more first magnetizing current pulses is equal to an amount of charge delivered to the load of the power converter by the one or more second magnetizing current pulses.

14. The power converter of claim 13, wherein:

the peak current amplitude of a magnetizing pulse of the one or more first magnetizing current pulses is greater than the maximum current threshold value during the first switching cycle of the power converter; and the second number of magnetizing current pulses is greater than the first number of magnetizing current pulses.

15. The power converter of claim 13, wherein:

the peak current amplitudes of a first magnetizing pulse and a second magnetizing pulse of the one or more first magnetizing pulses are less than the minimum current threshold value during the first switching cycle of the power converter; and the second number of magnetizing current pulses is less than the first number of magnetizing current pulses.

16. The power converter of claim 13, further comprising:

an auxiliary winding of the transformer; and a resistor-capacitor (RC) divider circuit coupled to the auxiliary winding, the RC divider circuit comprising:

a first resistor having a first node directly electrically connected to a first node of the auxiliary winding;

an integrator capacitor having a first node directly electrically connected to a second node of the first resistor and a second node directly electrically connected to a second node of the auxiliary winding; and an integrator reset switch having a drain node directly electrically connected to the first node of the integrator capacitor and a source node directly connected to ground, the integrator reset switch being controlled by the primary side controller circuit;

wherein the primary side controller circuit is configured to receive a voltage developed at the first node of the integrator capacitor to generate the indirect measurement of the magnetizing current, the voltage developed at the first node of the integrator capacitor being representative of the magnetizing current.

17. The power converter of claim 16, wherein:

the peak current amplitudes of the one or more first magnetizing current pulses are determined using the indirect measurement of the magnetizing current.

* * * * *